(12) United States Patent
Travagline et al.

(10) Patent No.: US 6,445,967 B1
(45) Date of Patent: Sep. 3, 2002

(54) METHOD AND APPARATUS FOR CONTROLLING THE USE OF CHEMICALS WITH EXPIRATION DATES

(75) Inventors: David Louis Travagline; Vishnu Vandana, both of Wappinger Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/396,933

(22) Filed: Sep. 15, 1999

(51) Int. Cl.[7] .......................... G06F 19/00; G05D 7/00; H01L 21/00
(52) U.S. Cl. ........................ 700/99; 700/106; 700/121; 700/283; 438/5
(58) Field of Search ............................. 700/16, 21, 27, 700/80, 106, 109, 121, 171, 175, 283, 99–101; 438/5, FOR 101, FOR 141, FOR 142; 436/50

(56) References Cited

U.S. PATENT DOCUMENTS

| | | |
|---|---|---|
| 5,295,065 A | 3/1994 | Chapman et al. |
| 5,487,144 A | 1/1996 | Takahashi et al. |
| 5,611,051 A | 3/1997 | Pirelli |
| 5,664,112 A | 9/1997 | Sturgeon et al. |
| 5,699,259 A | 12/1997 | Colman et al. |
| 5,719,059 A * | 2/1998 | Mimura et al. ............... 422/64 |
| 5,726,884 A | 3/1998 | Sturgeon et al. |
| 5,925,014 A * | 7/1999 | Teeple, Jr. ............. 128/203.13 |
| 6,049,784 A * | 4/2000 | Weatherly et al. ............. 705/1 |
| 6,311,163 B1 * | 10/2001 | Sheehan et al. ............... 705/2 |

* cited by examiner

*Primary Examiner*—Leo Picard
*Assistant Examiner*—Elliot Frank
(74) *Attorney, Agent, or Firm*—Jay Anderson; Cantor Colburn LLP

(57) ABSTRACT

A method and apparatus are provided for controlling the use of chemical materials in a semiconductor factory. The control is based upon the relationship among certain important dates relative to the useful life of the chemical materials used in the semiconductor manufacturing process. These dates include the current date and the expiration date, a critical date and a warning date for each chemical used on a particular assembly line. The expiration date is based upon a date beyond which the chemicals are not to be used in the semiconductor factory process. The critical date is usually no more than 3–4 days before the expiration date. Certain chemicals need more careful monitoring during this critical period. The warning date, usually a week before the expiration date, is used to alert the relevant engineering and production staff that a period of close attention on a particular production run is required. There are four major decision points in the method that is implemented by the apparatus.

26 Claims, 4 Drawing Sheets

METHOD AND APPARATUS FOR CONTROLLING THE USE OF CHEMICALS WITH EXPIRATION DATES

BACKGROUND OF THE INVENTION

The present invention relates to the control of a semiconductor assembly line based on the life of certain chemicals used in the fabrication and assembly process. In particular, the expected life of certain lithography photoresists and anti-reflective materials is used to control the fabrication and assembly process.

There exist numerous containers of photoresist and anti-reflective materials (chemical material) with varying expiration dates for tracks in the semiconductor factory. The term "tracks" is used herein to refer to the assembly process equipment in a semiconductor factory that produce the semiconductor devices in a step by step process; the term "lot" refers to one or more semiconductor wafers processed together. The containers of chemical materials have expiration dates on them, but the expiration dates are independent of the tracks and the lots they run. The containers are usually known as NOWPAKs in the semiconductor industry, but any containers containing liquid chemicals can be generally used. (NOWPAK® is a registered trademark of Now Technologies Incorporated.) This invention is applicable to all processes involving chemicals with expiration dates, irrespective of the types of containers used in the factory. A lot can be classified as an individual wafer or a cassette of wafers containing any number of wafers. When a track runs a specific lot with an expired photoresist or anti-reflective material, it can cause scrap or rework.

There is a need for an automated system attached to a track that will monitor and control the product. This includes stopping production on the track if a critical period or expiration date of the chemical material has been reached. Currently, the tracks do not have any such device that will monitor and control the product in conjunction with the life of the chemical materials. Presently, operators are relied upon to monitor when the containers being used on a set of tracks are nearing their expiration dates and when they have reached or passed their expiration dates.

In a semiconductor factory, the containers of chemicals (containers) are supposed to be checked on a daily basis. This is usually done at the beginning of each shift. The operator is supposed to manually check the expiration date on the containers and contact engineering personnel if the resist or anti-reflective ("ARC") material has expired. In the line, most of the photoresists such as CGR, APEX-E and UV2HS and anti-reflective materials such as BARL typically have an expected lifetime of 9 months to 1 year. The actual expiration date is listed on the chemical container by the manufacturer. In most cases, the resist/ARC material would be consumed on the tracks well before the expiration date. Therefore, the operator would never run into an expiration condition for the above mentioned chemicals. However, with certain new resists such as JSR M20G, UV82, M22G, M60G, UVN30, UV110 and UV5HS, and anti-reflective materials such as AR3, AR6 and DUV30, the expected lifetime is 6 months and it is common for these materials to be used right up through their expiration dates. With multiple process tools, using multiple tracks, using multiple resists/ARCs with different expiration dates, and with the current set of controls on the tools, it is not possible to ensure that product is not run on the tracks with expired chemicals. The current set of controls includes operators checking and monitoring the expiration date of chemicals on every track at the beginning of their shift and informing the relevant engineering personnel when a material has expired. These controls help in monitoring the expiration dates of the materials used on the tracks but do not ensure that the materials are not used beyond their expiration dates. There is not a mechanism to notify manufacturing and engineering teams about expiring chemicals for appropriate actions. There is thus a potential exposure to run lots with expired chemicals. This would cause running of the tracks in "Out Of Compliance" conditions.

The newer resists and ARC materials have critical periods (typically 2 to 3 days) just before their expiration dates during which various process problems may be anticipated. It has been found that some newer chemicals, such as AR3, that are used for the most critical processes in logic semiconductor fabrication have caused scrap product when used on or beyond its expiration date. It has also been found that using some newer materials, such as AR3, up to 4 days prior to expiration has caused process problems which affect the yield of certain processes such as the gate level in the semiconductors. Some of these levels are very critical in the semiconductor fabrication process; accordingly, the materials used for these processes must be monitored and controlled carefully a week prior to their expiration date.

SUMMARY OF THE INVENTION

In accordance with the present invention, a method and apparatus are provided for controlling the use of chemical materials in a semiconductor factory. The control is based upon the relation of certain important dates relative to the useful life of the chemical materials used in the semiconductor fabrication process. These dates include the relationship between the current date with the expiration date, a critical date and a warning date for each chemical used on a particular assembly line.

The expiration date is based upon a date beyond which the chemicals are not to be used in the semiconductor factory process. The critical date is usually no more than 3–4 days before the expiration date. Certain chemicals need more careful monitoring during this critical period. The warning date, usually a week before the expiration date, is used to alert the relevant engineering and production staff that a period of high order of attention on a particular production run is required.

There are four major decision points in the method that are implemented by the apparatus. A first decision point determines if a first date, the "current date," is prior to a second date, a "warning date." The first date selection process instructs the fabrication process to continue if the current date is prior to said warning date.

If the current date is later than the second date (the warning date) and if the current date is prior to a third date (a critical date), a second data selection circuitry instructs the fabrication process to continue and activates a first call warning circuit.

If the current date is later than the third date (the critical date), and if the current date is later than or equal to a fourth date (the expiration date), a third data selection circuitry instructs the fabrication process to stop and activates a third call warning circuit. If the third selection circuitry determines that said current date is earlier than the expiration date, it activates a second call warning circuit and prompts for a manual override signal to permit the process to continue after the critical date and before the expiration date.

A requeue selection permits the fabrication process to continue if the current date is earlier than the warning date, the current date is earlier than the critical date, or if the current date is earlier than expiration date and the manual override is activated. The requeue selection orders a stopping of the process when said current date is equal to or later than said expiration date or the manual override is not activated.

These and other features and advantages of the present invention will be apparent from the following brief description of the drawings, detailed description, and appended claims and drawings.

BRIEF DESCRIPTION OF THE DRAWINGS

The invention will be further described in connection with the accompanying drawings, in which.

DETAILED DESCRIPTION OF A PREFERRED EMBODIMENT OF THE INVENTION

Figure 1:
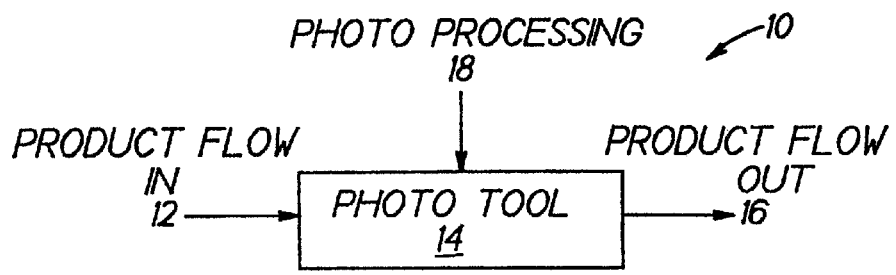
FIG. 1 illustrates a current method of photoresist and ARC photo processing in a semiconductor fabrication facility.

The current method of photo processing 10 in a semiconductor facility is illustrated in FIG. 1. The product flow is input into a photo tool 14 for photo-processing 18. The output of the photo tool 14 is product flow out 16. In this conventional method, the operator monitors the process and tool performance.

Figure 2:
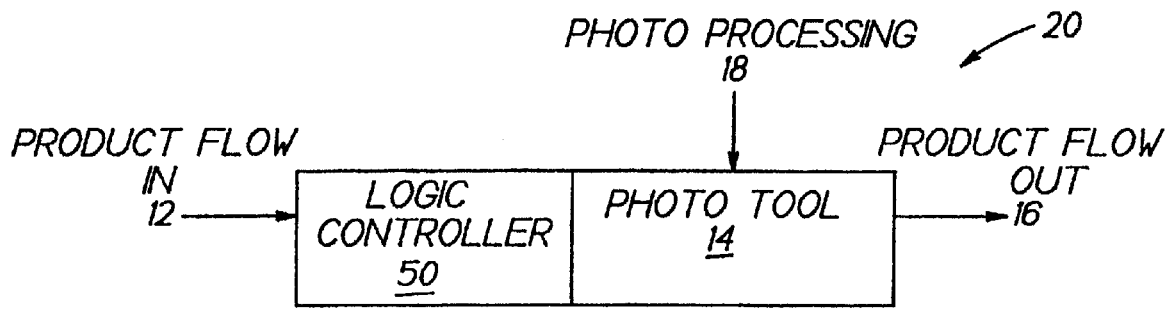
FIG. 2 illustrates the use of a logic controller for control of photoresist and ARC in a semiconductor fabrication facility, in accordance with the present invention.

As shown in FIG. 2, the preferred embodiment 20 of the present invention adds a logic controller 50 to the elements described above to monitor the photo chemicals used in photo tool 14 and shuts down product flow when the chemicals are approaching their end of life.

Logic controller 50, which is attached to the tracks, is an apparatus for controlling lithography photoresist and anti-reflective materials, and monitors and controls the product from running on the tracks if a critical period or expiration date of the photoresist or anti-reflective material (ARC) has been reached.

Controller 50 monitors and controls the lots from being started on a track if the expiration date of a resist/ARC has been reached. The lot is automatically stopped and the operator would be instructed on what to do next through corrective actions as provided by engineering personnel. The controller is installed on a specific set of tracks that run multiple resists and ARC materials with different expiration dates running various technologies. The controller will identify the specific process operation and recipe prior to starting the lot and determine if the required resist/ARC has expired or has reached the "Critical Warning Period." If the resist/ARC has reached the Critical Warning Period, the controller will warn the operator of the number of days remaining prior to expiration and inform the operator to take specific corrective actions as described in the warning message. The controller will automatically notify the appropriate engineers with all the details specific to the resist or ARC material and expiration date. The controller will also record the lot, date, time, and operator ID of a lot being processed during the critical warning period. In the case of certain date sensitive materials, engineering staff approval may be required for the lot to be processed if the material is going to expire within a few days. The short time period prior to expiration of certain chemicals, such as AR3, is very important since it takes approximately two days to change and qualify a new container of AR3 before semiconductor product can resume running on a specific track.

The controller has three programmable periods: Expiration Date; Critical Period (2 or 3 days prior to the expiration date); and Warning Period (typically 1 week prior to the expiration date). The controller utilizes the three programmable periods in order to provide the following control. The controller prevents lots from running when the expiration date has been reached. The controller will only allow lots to run with an engineering approval during the critical period. The controller automatically notifies engineering and production team members once lots are run during the warning period. The controller also provides the operator with corrective actions to follow. The controller records all important lot history data when lots are run during the warning or critical periods.

The controller benefits production and engineering personnel as it will give them prior notice to a need for a chemical change. Additionally, it assists them to better coordinate the new chemical installation and qualification process. This process can take as long as two days.

Installation of the controller prevents critical lots from being scrapped or misprocessed due to expired resists, ARC or other chemical materials. The engineering organization of a semiconductor manufacturer will also benefit by this controller as it will alert them to specific resist/ARC conditions and allow them to change a resist/ARC prior to its expiration date. The lot history data collected by the device can be analyzed by engineering personnel to determine if process or yield problems occur on lots that are coated with resists/ARCs that are at the end of their life cycle. The controller will aid a production department of a semiconductor manufacturer, as it will ensure that they never run with expired resists/ARCs. They can better plan tool downtime and throughput while new resists/ARCs are being qualified.

This invention will prevent lots from being run on the tracks with expired photoresist and anti-reflective materials. It solves the problem by monitoring and controlling the resist/ARC expiration dates and the lots being run on the tracks. This invention will ensure no misprocessing of lots due to expired resists/ARCs.

Figure 3:
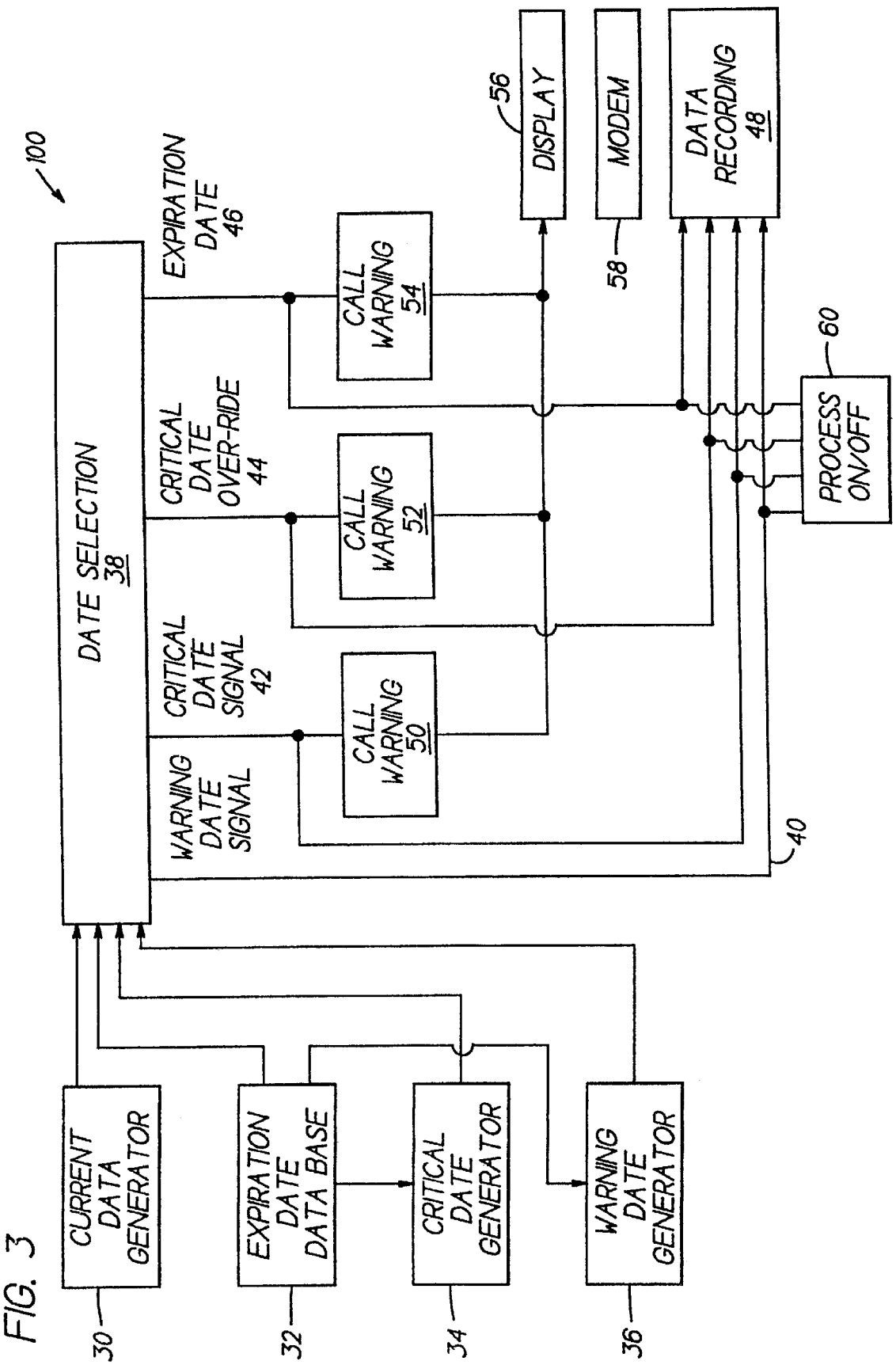
FIG. 3 is a block diagram of a logic controller in accordance with an embodiment of the present invention.

FIG. 3 is a block diagram of a logic controller 100. There are four date generators: current date 30, expiration date data base 32, critical date generator 34, and warning date generator 36. The critical date generator 34 and warning date generator 36 get input from the expiration date data base 32, as discussed above. Each of these dates is coupled to a date selection module 38.

The date selection module 38 determines a warning date signal 40, critical date signal 42, a critical date override signal 44 and an expiration date signal 46. Each of these signals is coupled to the data recording system 48 to record the operation data of the logic controller 100. In addition there are three call warning modules 50, 52 and 54 which provide data to the operator, production personnel and engineering personnel concerning the status of the process relative to the several dates. These warning signals are coupled to a display system for the operator and to a modem for transmission of the data to off site personnel. The details of the operation of this apparatus are discussed below.

Figure 4:
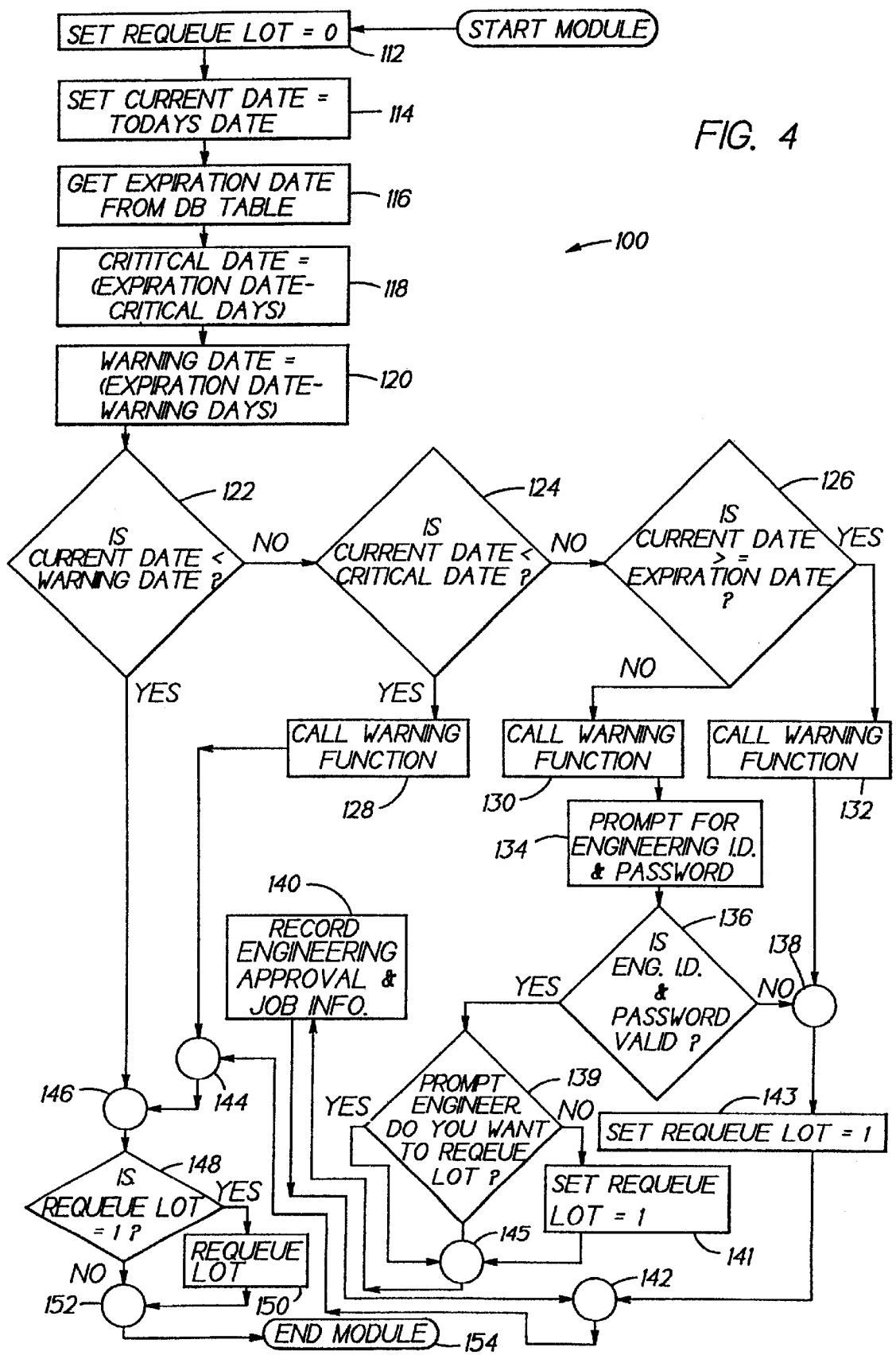
FIG. 4 is a flow diagram of the operation of a logic controller in a semiconductor facility, in accordance with an embodiment of the present invention.

FIG. 4 is a flow chart of the operation of the controller 100. The process begins a "Set Requeue_lot=0" signal 112 which in turn is connected to a "Set Current_date =today's date"module 114. Today's date is coupled to a module 116, "Get Expiration_date from DB table," that obtains an expiration date for each material used in the process from a data base table. The expiration date for each chemical used in the process is entered into the table when the chemical is loaded. Critical dates for each chemical are generated by a critical date module 118. The critical date is equal to the expiration date minus critical days for each a particular chemical. Certain warning dates for each chemical are generated by a warning date module 120. The warning date is equal to the expiration date minus "Warning_days." The "Critical_days" and the "Warning_days" are predetermined values for each chemical material. These four dates are coupled to the remaining portions of the controller that uses these dates for each chemical to make certain decisions with regard to the flow of the lots.

The four dates for each chemical (current date, expiration date, critical date and warning date) are processed into three decision modules. If the current date is earlier than the warning date for a particular chemical, an "Is Current Date<Warning Date" module 122 in conjunction with the remainder of the controller, discussed below, permits the processing of the lots to continue.

If the current date is later than the warning date, a second decision module "Is Current Date prior to Critical Date" 124 is queried. If the current date is later than the warning date and earlier than the critical date, the "Is Current Date prior to Critical Date" module 124 activates a first call warning function 128 and will instruct the semiconductor assembly process to continue. The functions of the various call warning functions will be discussed below.

If the current date is later than the warning date and the critical date, a third decision module "Is Current Date later than or equal to the Expiration Date" (module 126) is queried. If the current date is earlier than the expiration date, a second call warning function 130 is activated and a manual override sub system is notified. If the current date is later than or equal to the expiration date, the "Is Current Date later than or equal to the Expiration Date" module 126 activates a third call warning function 132 and instructs the process to stop.

In order to minimize scrap and other losses, it is important to have engineering oversight when the process is operating with a current date between the critical date and the expiration date. The manual override sub system mentioned above includes a "Prompt for Engineering ID and Password" module 134. If decision module 136, "Is Engineering ID & Password Valid ?" indicates a valid engineering ID and a valid password, and the answer to "Prompt Engineering: Do you want to requeue the lot?" (module 139) is No, it permits the process to continue. This approval is done through a module with a record of engineering approval with the appropriate job information by "Record Engineering Approval and Job Information," module 140. If the answer is Yes, "Set Requeue_lot=1" (module 143) is set. If the "Is Engineering ID & Password Valid?" decision module does not receive a valid engineering ID and password, the process is instructed to stop through "Set Requeue_lot=1," module 143.

The date oriented decisions discussed above are connected to a final decision module "Is Requeue Lot=1" 148 via logic couplers 138, 142, 144, 145 and 146 to instruct the process whether or not to continue. If the current date is before any of the other dates (warning date, critical date or expiration date), the value of Requeue_lot is equal to 0 and the decision module 148 instructs the fabrication process to continue. The same is true if the current date is after the warning date, but before the critical date. The same is also true if the current date is after the critical date and before the expiration date and the manual override subsystem discussed above has received valid instructions. The only times the "Is Requeue_lot=1" (module 148) is "Yes" is when the current date is after the critical date without a manual override or when the current date is later than or the same as the expiration date.

Each of the warning function subsystems works the same way. Each produces slightly different results. The results are dependent upon which warning function they serve. The first warning function warns the appropriate recipients that the current date is later than the warning date, but earlier than the critical date and the expiration date. The second warning function warns the appropriate recipients that the current date is after the warning and critical dates, but is prior to the expiration date. The third warning function is when the current date is after the warning date, the critical date and is after or the same as the expiration date.

Figure 5:
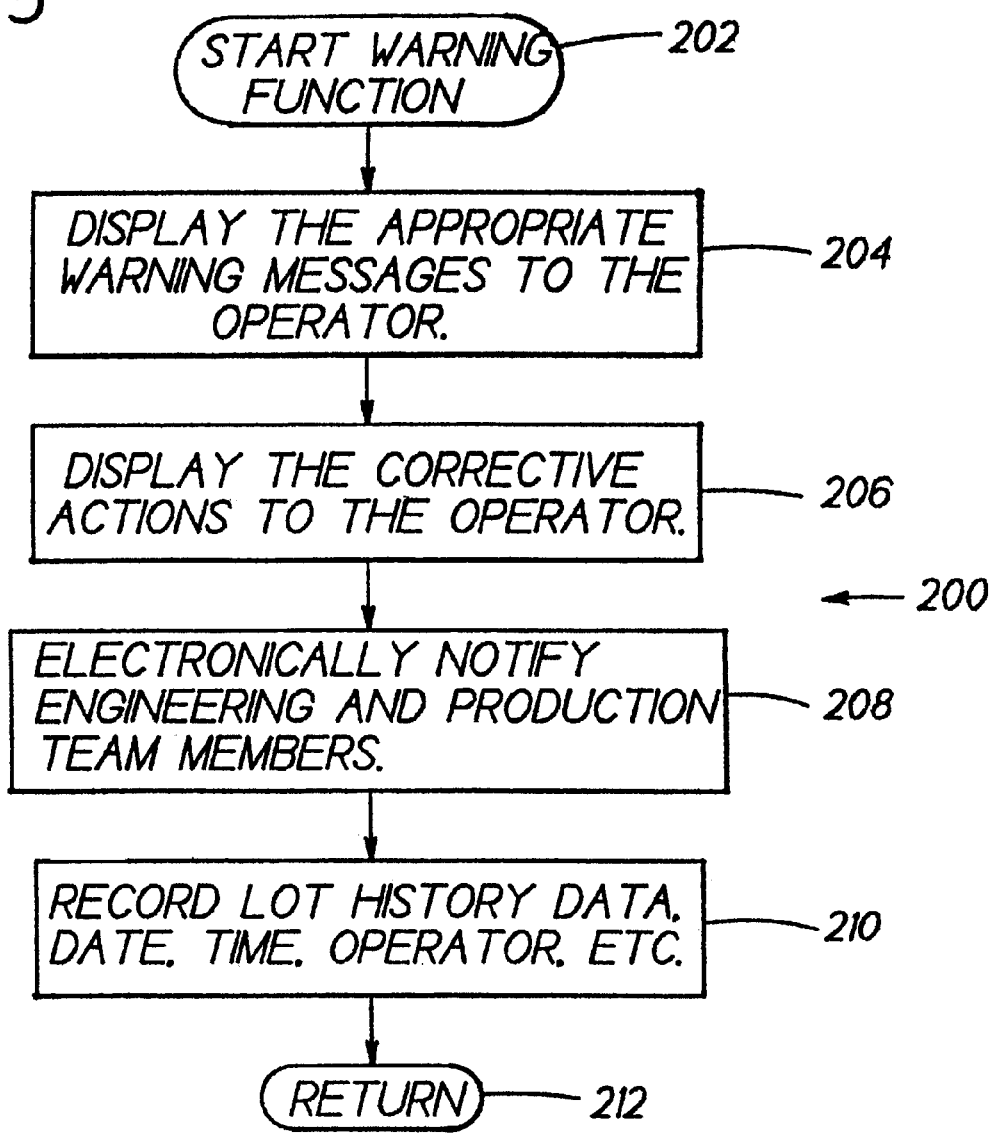
FIG. 5 is a flow diagram of a warning function of the logic controller shown in FIG. 3.

A warning function 200 is illustrated in the flow diagram of FIG. 5. The warning function starts (step 202) on being called by the calling module 128, 130 or 132. An appropriate warning message is displayed to the operator (step 204) followed by a listing of the corrective actions to be taken by the operator (step 206). The warning function electronically notifies the appropriate engineering and production personnel of the status of the fabrication process based upon the dates outlined above (step 208). In addition, the warning function records (step 210) lot history data including dates, time, operator and other information relevant to the process. The function then returns (step 212) to the next appropriate point in the flow diagram of FIG. 4.

While the exemplary embodiment illustrates the use of a logic controller to control a semiconductor fabricating process based upon certain important dates related to the chemicals used, the invention is not limited to use in the semiconductor industry. Any process in which the quality of the finished product is subject to expiration date and/or the near expiration dates of its ingredients can use the principles of this invention.

The present invention can be embodied in the form of computer-implemented processes and apparatuses for practicing those processes. The present invention can also be embodied in the form of computer program code containing instructions embodied in tangible media, such as floppy diskettes, CD-ROM's, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to preferred embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed as the best mode contemplated for this invention, but that the invention will include all embodiments falling within the scope of the appended claims.

We claim:

1. A logic controller to control the use of chemical materials used in a manufacturing process comprising:

a data input module with data indicating a first date, a second date, a third date, and a fourth date wherein second, third and fourth dates are progressively later in time;

a first data selection circuit, wherein said data selection circuit determines if said first date is prior to said second date and further wherein said first data selection process instructs said manufacturing process to continue if said first date is prior to said second date;

a second data selection circuit, wherein if said first data selection circuit determines is said first date is later than said second date, said second data selection circuit determines is said first date is prior to said third date and further wherein said second data selection circuitry instructs said manufacturing process to continue if said first date is prior to said third date and activates a first call warning circuit;

a third data selection circuit, wherein if said second data selection circuit determines if said first date is later than said third date, said third data selection circuit determines if said first date is later than or equal to said fourth date and further wherein said third data selection circuitry instructs said manufacturing process to stop if said first date is later than or equal to said fourth date and activates a second call warning circuit and further wherein if said third selection circuitry determines that said fourth date is earlier than said first date it activates a third call warning circuit and prompts for a manual override signal to permit said process to continue after said third date and before said first date; and a requeue selection circuit, wherein said requeue permits said process to continue if said first date is earlier than said second date, said first date is earlier than said third date, or said first date is earlier than said fourth date and said manual override is activated and further wherein said requeue selection orders a stopping of said process when said first date is equal to or later than said fourth date or said manual override is not activated.

2. The logic controller of claim 1, wherein said first date is a current date.

3. The logic controller of claim 2, wherein said fourth date is a predetermined expiration date.

4. The logic controller of claim 3, wherein said second date is a warning date equal to said expiration date minus a predetermined number of warning days.

5. The logic controller of claim 3, wherein said third date is a critical date equal to said expiration date minus a predetermined number of critical days.

6. The logic controller of claim 1, wherein said call warning circuits comprise:

a first display of one or more warning messages to an operator;

a second display of the corrective actions to said operator;

a notification system to notify engineering and production team members; and a recording mechanism for recording data, wherein specific messages and notification are a function of a location of said warning circuitry.

7. A computer usable medium having computer readable program code means embodied therein for controlling the use of chemical materials used in a manufacturing process, said medium comprising:

computer readable program code means for causing a computer to store data indicating a first date, second date; a third date, and a fourth date, wherein said second, third and fourth dates are progressively later in time; computer readable program code means for causing a computer to perform a first data selection, wherein said data selection determines if said first date is prior to said second date and further wherein said first data selection process instructs said manufacturing process to continue if said first date is prior to said second date;

computer readable program code means for causing a computer to perform a second data selection, wherein if said first data selection determines said first date is later than said second date, said second data selection determines if said first date is prior to said third date and further wherein said second data selection instructs said manufacturing process to continue if said first date is prior to said third date and activates a first call warning circuit;

computer readable program code means for causing a computer to perform a third data selection, wherein if said second data selection determines if said first date is later than said third date, said third data selection determines if said first date is later than or equal to said fourth date and further wherein said third data selection instructs said manufacturing process to stop if said first date is later than or equal to said fourth date and activates a second call warning circuit and further wherein if said third selection determines that said fourth date is earlier than said first date it activates a third call warning circuit and prompts a manual override signal to permit said process to continue after said third date and before said first date; and computer readable program code means for causing a computer to perform a requeue decision, wherein said requeue decision permits said process to continue if said first date is earlier than said second date, said first date is earlier than said third date, or said third date is earlier than said fourth date and said manual override is activated and further wherein said requeue selection orders a stopping of said process when said first date is equal to or later than said fourth date or said manual override is not activated.

8. The medium of claim 7, wherein said first date is a current date.

9. The medium of claim 7, wherein said fourth date is a predetermined expiration date.

10. The medium of claim 9, wherein said second date is a warning date equal to said expiration date minus a predetermined number of warning days.

11. The medium of claim 9, wherein said third date is a critical date equal to said expiration date minus a predetermined number of critical days.

12. A method for controlling use of chemical materials in a manufacturing process comprising:

entering data input indicating a first date, second date; a third date and a fourth date, wherein said second, third and fourth dates are progressively later in time;

determining if said first date is prior to said second date and further wherein this first data selection instructs said manufacturing process to continue if said first date is prior to said second date;

determining if said first data selection determines if said first date is later than said second date, a second data selection determines if said first date is prior to said third date and said second data selection instructs said manufacturing process to continue if said first date is prior to said third date and a first call warning circuit is activated;

determining if said second data selection determines if said first date is later than said third date, a third data selection circuit determines if said first date is later than or equal to said fourth date and said third data selection instructs said manufacturing process to stop if said first date is later than or equal to said fourth date and activates a second call warning circuit and if said third selection circuitry determines that said fourth date is earlier than said first date a third call warning circuit is activated and a manual override signal to permit said process to continue after said third date and before said first date is prompted; and instructing process to continue if said first date is earlier than said second date, said first date is earlier than said third date, or said first date is earlier than said fourth date and said manual override is activated; and instructing said process to stop when said first date is equal to or later than said fourth date.

13. The method of claim 12, wherein said first date is a current date.

14. The method of claim 12, wherein said fourth date is a predetermined expiration date.

15. The method of claim 14, wherein said second date is a warning date equal to said expiration date minus a predetermined number of warning days.

16. The method of claim 14, wherein said third date is a critical date equal to said expiration date minus a predetermined number of critical days.

17. A program storage device readable by a machine, tangibly embodying a program of instructions executable by said machine to perform method steps for controlling use of chemical materials in a semiconductor manufacturing process, said method steps comprising:

entering data input indicating a first date, second date; a third date, and a fourth date, wherein said second, third, and fourth dates are progressively later in time;

determining is said first date is prior to said second date and further wherein this first data selection instructs said manufacturing process to continue if said first date is prior to said second date;

determining if said first data selection determines if said first date is later than said second date, a second data selection determines if said first date is prior to said third date and said second data selection instructs said manufacturing process to continue if said first date is prior to said third date and a first call warning circuit is activated;

determining is said second data selection determines if said first date is later than said third date, a third data selection circuit determines if said first date is later than or equal to said fourth date and said third data selection instructs said manufacturing process to stop if said first date is later than or equal to said fourth date and activates a second call warning circuit and if said third selection circuitry determines that said fourth date is earlier than said first date a third call warning circuit is activated and a manual override signal to permit said process to continue after said third date and before said first date is prompted; and instructing process to continue if said first date is earlier than said second date, said first date is earlier than said third date, or said first date is earlier than said fourth date and said manual override is activated; and instructing said process to stop when said first date is equal to or later than said fourth date.

18. The method of claim 17, wherein said first date is a current date.

19. The method of claim 17, wherein said fourth date is a predetermined expiration date.

20. The method of claim 19, wherein said second date is a warning date equal to said expiration date minus a predetermined number of warning days.

21. The method of claim 19, wherein said third date is a critical date equal to said expiration date minus a predetermined number of critical days.

22. A computer program product for controlling use of chemical materials in a semiconductor manufacturing process, said computer program product comprising:

a computer usable medium having computer readable program code means embodied in said medium for controlling use of chemical materials in a semiconductor fabrication process, said computer program product having computer readable program code means for entering data input indicating a first date, second date; a third date, and a fourth date, wherein said second, third, and fourth dates are progressively later in time;

computer readable program code means for determining is said first date is prior to said second date and further wherein this first data selection instructs said manufacturing process to continue if said first date is prior to said second date; computer readable program code means for determining if said first data selection determines if said first date is later than said second date, a second data selection determines if said first date is prior to said third date and said second data selection instructs said manufacturing process to continue is said first date is prior to said third date and a first call warning circuit is activated;

computer readable program code means for determining if said second data selection determines if said current date is later than said third date, a third data selection circuit determines if said first date is later than or equal to said fourth date and said third data selection instructs said manufacturing process to stop if said first date is later than or equal to said fourth date and activates a second call warning circuit and if said third selection circuitry determines that said fourth date is earlier than said first date a third call warning circuit is activated and a manual override signal to permit said process to continue after said third date and before said first date is prompted; and computer readable program code means for instructing process to continue if said first date is earlier than said second date, said first date is earlier than said third date, or said first date is earlier than said fourth date and said manual override is activated; and computer readable program code means for instructing said process to stop when said first date is equal to or later than said fourth date.

23. The method of claim 22, wherein said first date is a current date.

24. The method of claim 22, wherein said fourth date is a predetermined expiration date.

25. The method of claim 24, wherein said second date is a warning date equal to said expiration date minus a predetermined number of warning days.

26. The method of claim 24, wherein said third date is a critical date equal to said expiration date minus a predetermined number of critical days.

\* \* \* \* \*